US011067816B1

(12) United States Patent
Ghosh

(10) Patent No.: US 11,067,816 B1
(45) Date of Patent: Jul. 20, 2021

(54) SCATTERING STED LITHOGRAPHY

(71) Applicant: Vathys, Inc., Portland, OR (US)

(72) Inventor: Tapabrata Ghosh, Portland, OR (US)

(73) Assignee: Vathys, Inc., Portland, OR (US)

( * ) Notice: Subject to any disclaimer, the term of this patent is extended or adjusted under 35 U.S.C. 154(b) by 0 days.

(21) Appl. No.: 16/796,398

(22) Filed: Feb. 20, 2020

(51) Int. Cl.
*G03F 7/20* (2006.01)
*G02B 27/09* (2006.01)
*G02B 27/10* (2006.01)
*G02B 27/58* (2006.01)
*G02F 1/35* (2006.01)

(52) U.S. Cl.
CPC ..... *G02B 27/0927* (2013.01); *G02B 27/0905* (2013.01); *G02B 27/1006* (2013.01); *G02B 27/58* (2013.01); *G03F 7/70191* (2013.01); *G02F 1/35* (2013.01); *G02F 2203/05* (2013.01)

(58) Field of Classification Search
CPC ............... G01N 21/65; G01N 21/6458; G01N 21/6428; G02B 27/58; G02B 21/16; G02B 21/0076; G02B 21/0032; G02B 27/0927; G02B 27/0905; G02B 27/1006; H05G 2/008; G03F 7/70191; G03F 7/70033; G03F 7/70575; G03F 7/70616; G03F 7/70058; H01S 3/225; B22F 3/1055; G02F 2203/05; G02F 1/35
See application file for complete search history.

(56) References Cited

U.S. PATENT DOCUMENTS

2006/0183059 A1* 8/2006 Menon ................ G03F 7/70275
430/322

OTHER PUBLICATIONS

Zeloof, "Maskless Photolithography", 2018, http://sam.zeloof.xyz/maskless-photolithography/, Retrieved Jan. 29, 2020.
Zhuang et al., High focusing efficiency in subdiffraction focusing metalens, Jun. 22, 2019, Nanophotonics, vol. 8, Issue 7; https://www.degruyter.com/view/j/nanoph.2019.8.issue-7/nanoph-2019-0115/nanoph-2019-0115.xml, Retrieved Jan. 29, 2020.
Li et al., "Feasibility of resonant metalens for the subwavelength imaging using a single sensor in the far field", Jul. 25, 2014, Optics Express, https://www.osapublishing.org/DirectPDFAccess/831F2E08-9B8AAA6E-22877D2B1D7BE138_297209/oe-22-15-18688.pdf?da=1&id=297209&seq=0&mobile=no, Retrieved Jan. 29, 2020.

(Continued)

*Primary Examiner* — Mesfin T Asfaw
(74) *Attorney, Agent, or Firm* — Cognition IP, P.C.; Edward Steakley

(57) ABSTRACT

Disclosed are systems and methods for achieving sub-diffraction limit resolutions in lithography. In one embodiment, a lithography system is disclosed. The system includes, a first light source, configured to generate excitation laser beams; a second light source, configured to generate depletion laser beams; one or more scattering mediums configured to receive one or more of the excitation laser beams and depletion laser beams and scramble the laser beams; one or more wave-front shaping modules, configured to receive the scrambled laser beams, descramble the laser beams and generate one or more focused laser beams; a numerical aperture device configured to receive the one or more focused laser beams and generate a focused point on a substrate.

20 Claims, 12 Drawing Sheets

(56) References Cited

OTHER PUBLICATIONS

Lemoult et al., "Resonant Metalenses for Breaking the Diffraction Barrier", Apr. 14, 2010, physics.optics, https://arxiv.org/pdf/1006.0799.pdf, Retrieved Jan. 29, 2020.

Lemoult et al., "A polychromatic approach to far-field superlensing at visible wavelengths", Jun. 6, 2012, Nature, https://www.nature.com/articles/ncomms188, Retrieved Jan. 29, 2020.

Maznev et al., "Upholding the diffraction limit in the focusing of light and sound", Feb. 25, 2016, Wave Motion 68, 182-189, https://arxiv.org/abs/1602.07958, Retrieved Jan. 29, 2020.

Vellekoop et al., "Exploiting disorder for perfect focusing", Oct. 5, 2009, Nature Photonics, https://arxiv.org/abs/0910.0873. Retrieved Jan. 29, 2020.

Choi et al., "Overcoming the Diffraction Limit Using Multiple Light Scattering in a Highly Disordered Medium", Jul. 6, 2011, NCBI, https://www.ncbi.nlm.nih.gov/pmc/articles/PMC3345286/, Retrieved Jan. 29, 2020.

Buchegger et al., "Stimulated Emission Depletion Lithogrpahy with Mercapto-Functional Polymers," Jan. 27, 2016, ACS Publications, https://pubs.acs.org/doi/pdf/10.1021/acsnano.5b05863. Retrieved Feb. 19, 2020.

\* cited by examiner

SCATTERING STED LITHOGRAPHY

BACKGROUND

Field

This invention relates generally to the field of photolithography, and more particularly to high-resolution photolithography techniques for manufacturing, including manufacturing integrated circuits or microstructures.

Description of the Related Art

Modern electronics have benefitted immensely from shrinking integrated circuit (IC) sizes and more transistors per unit of area. Shrinking transistor sizes and more computing power per unit of area have approximately followed industry predictions, such as those made according to Moore's law. Underlying this advancement has been the ability to fabricate smaller transistors per unit of area using advanced photolithography techniques. However, recently, advancements in fabrication technology and photolithography using conventional optical instruments are reaching their physical limits. Consequently, if further advancements in shrinking transistor sizes and fabrication of more dense computing systems are desired, there is a need for more advanced fabrication techniques that can overcome limitations presented by conventional photolithography instruments.

SUMMARY

In one aspect, a lithography system is disclosed. The system includes: a first light source, configured to generate excitation laser beams; a second light source, configured to generate depletion laser beams; one or more scattering mediums configured to receive one or more of the excitation laser beams and depletion laser beams and scramble the laser beams; one or more wave-front shaping modules, configured to receive the scrambled laser beams, descramble the laser beams and generate one or more focused laser beams; and a numerical aperture device configured to receive the one or more focused laser beams and generate a second focused beam on a substrate.

In one embodiment, the wave-front shaping module, further comprises a compensation pattern generated based at least partly on the pattern of scattering by the one or more scattering mediums, and wherein the compensation pattern is learned and generated with one or more machine learning, stochastic search, and Metropolis-Hastings.

In another embodiment, the system further includes a mask, wherein the mask comprises a pattern of integrated circuit devices to be fabricated on the substrate, wherein the substrate comprises a silicon wafer.

In some embodiments, the wave-front shaping module comprises a fabrication mask, comprising a pattern of integrated circuit devices to be fabricated on the substrate, and wherein the substrate comprises a silicon wafer.

In one embodiment, the wave-front shaping module comprises one or more of a holographic mask, a normal mask, a digital micrometer device, and a spatial light modulator.

In another embodiment, the wave-front shaping module comprises an array of phase-modulated segments, whose positions and phase can be adjusted with a learning feedback algorithm to generate the one or more focused laser beams.

In some embodiments, the system further includes a processor configured to: generate a transmission matrix based on input/output response of the scattering medium; determine a correlation between the transmission matrix and the scrambled laser beams; and based on the correlation configure the wave-front shaping module to receive the scattered laser beams and generate the one or more focused laser beams.

In another embodiment, the system further includes: nonlinear photoresist material deposited on the substrate, wherein the photoresist material undergoes polymerization depending on wavelengths of light received at the nonlinear photoresist material; a processor configured to selectively emit laser beams from the light sources at a plurality of wavelengths, wherein the wavelengths are chosen based at least partly on a pattern to be formed in the nonlinear photoresist material.

In some embodiments, the substrate comprises Mercapto-functional polymers.

In another aspect, a method of lithography is disclosed. The method includes: generating excitation laser beams with a first light source; generating depletion laser beams with a second light source; scrambling the laser beams with one or more scattering mediums configured to receive one or more of the excitation laser beams and depletion laser beams and scramble the laser beams; descrambling the scrambled laser beams with one or more wave-front shaping modules, configured to receive the scrambled laser beams and descramble the laser beams and generate one or more focused laser beams; and receiving the one or more focused laser beams at a numerical aperture device, configured to generate a second focused beam on a substrate.

In some embodiments, the wave-front shaping module, further comprises a compensation pattern generated based at least partly on the pattern of scattering by the one or more scattering mediums, wherein the compensation pattern is learned and generated with one or more machine learning, stochastic search, and Metropolis-Hastings.

In another embodiment, the method further includes providing a mask, wherein the mask comprises a pattern of integrated circuit devices to be fabricated on the substrate, wherein the substrate comprises a silicon wafer.

In some embodiments, the wave-front shaping module comprises a fabrication mask, comprising a pattern of integrated circuit devices to be fabricated on the substrate, and wherein the substrate comprises a silicon wafer.

In one embodiment, the wave-front shaping module comprises one or more of a holographic mask, a normal mask, a digital micrometer device, and a spatial light modulator.

In some embodiments, the wave-front shaping module comprises an array of phase-modulated segments, whose positions and phase can be adjusted with a learning feedback algorithm to generate the one or more focused laser beams.

In one embodiment, the method further includes: generating a transmission matrix based on input/output response of the scattering medium; determining a correlation between the transmission matrix and the scrambled laser beams; and based on the correlation, configuring the wave-front shaping module to receive the scattered laser beams and generate the one or more focused laser beams.

In another embodiment, the method further includes: depositing nonlinear photoresist material on the substrate, wherein the photoresist material undergoes polymerization depending on wavelengths of light received at the nonlinear photoresist material; and selectively emitting laser beams from the light sources at a plurality of wavelengths, wherein the wavelengths are chosen based at least partly on a pattern to be formed in the nonlinear photoresist material.

In one embodiment, the substrate comprises Mercapto-functional polymers.

In another aspect a method of STED-enhanced scattering lithography is disclosed. The method includes: generating excitation laser beams from a first STED light source; generating depletion laser beams from a second STED light source; scrambling the excitation and depletion laser beams with one or more scattering mediums; descrambling the scrambled laser beams with one or more wave-front shaping modules; and generating an effective illumination spot on a substrate, wherein the effective illumination spot comprises a sub-diffraction limit resolution and the effective illumination spot further comprises the descrambled laser beams.

In some embodiments, the effective illumination spot further comprises a Gaussian spot generated from the descrambled excitation laser beams and a doughnut depletion region generated from the descrambled depletion laser beams.

BRIEF DESCRIPTION OF THE DRAWINGS

These drawings and the associated description herein are provided to illustrate specific embodiments of the invention and are not intended to be limiting.

DETAILED DESCRIPTION

Figure 1A:
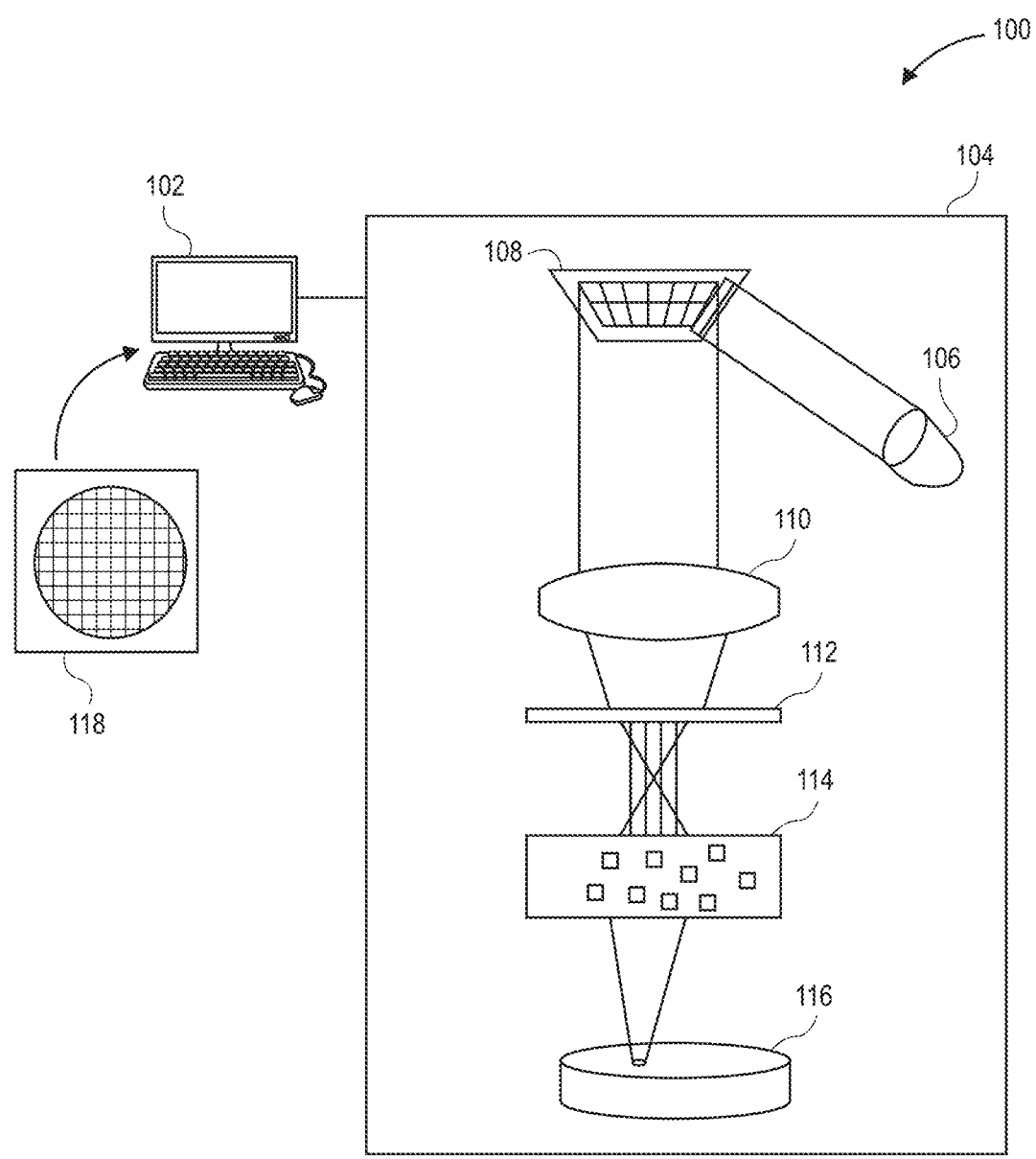
FIG. 1A illustrates a scattering photolithography system, which can be utilized in combination with a direct writing technique to fabricate integrated circuits on a silicon wafer with a resolution higher than diffraction-limited systems.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Unless defined otherwise, all terms used herein have the same meaning as are commonly understood by one of skill in the art to which this invention belongs. All patents, patent applications and publications referred to throughout the disclosure herein are incorporated by reference in their entirety. In the event that there is a plurality of definitions for a term herein, those in this section prevail. When the terms "one", "a" or "an" are used in the disclosure, they mean "at least one" or "one or more", unless otherwise indicated.

Definitions

The term "evanescent wave" refers to an oscillating electric and/or magnetic field that does not propagate as an electromagnetic wave but whose energy is spatially concentrated in the vicinity of the source (oscillating charges and currents).

The term "subwavelength" is used to describe an object having one or more dimensions smaller than the length of the wave with which the object interacts.

Need for Improved Photolithography Techniques

Integrated circuits present a tour de force of technological accomplishments and underpin modern computing systems. The success of integrated circuits to a large degree has been driven by the successful application of the Moore's Law, which states in part that, the number of transistors in an integrated circuit roughly doubles every two years. An enormous amount of progress in the integration of more and more components (e.g., transistors) on an integrated circuit has been achieved and the Moore's Law has held true over the past few decades. Advanced techniques in photolithography, which are used to define and fabricate miniaturized features and patterns, have been critical to the continued success of integrated circuits.

The industry-dominant method of using photolithography has been to use a light source and a photomask, where the photomask is exposed with the light source (sometimes with multiple exposures) to pattern integrated circuit features and designs onto a photoresist material deposited on a silicon substrate. The patterns, features and designs on the photomask are replicated on the photoresist material. In other words, the photoresist material is used to transfer patterns, features and designs onto the silicon substrate by various methods including etching or other fabrication techniques.

Photolithography using a light source can be limited in the maximum achievable resolution by the Rayleigh's criterion for diffraction-limited systems, given by Equation 1.

$$R = 1.22 \frac{\lambda f}{d} = k1 \frac{\lambda}{NA} \qquad \text{Equation 1}$$

In Equation 1, "R" is the spatial resolution of a photolithography system, "λ" is the wavelength of the light source used in the system, f is the focal length of the lens used to focus the light source, "d" refers to the diameter of the light beam emitted by the light source, "NA," or "numerical aperture," refers to the range of angles over which a photolithography system can accept or emit light, and "k1" refers to an experimental parameter, which can be determined in a photolithography system to relate the spatial resolution "R" with wavelength "λ" and numerical aperture "NA".

The smaller the spatial resolution, R, the higher resolution a photolithography system can achieve. To shrink transistor feature sizes even further, scaling the k1 factor and the numerical aperture has yielded better resolution, but those techniques are reaching their limits, as integrated circuits continue to shrink in size. Another technique called multiple patterning has been used in industry extensively to overcome low-resolution and other limitations of photolithography systems. These techniques, which have been deployed since the 28 nanometer (nm) process node, can increase fabrication cost, as the mask steps can increase exponentially and introduce overlay accuracy limitations.

To improve resolution, shorter wavelengths such as extreme ultraviolet (EUV) or X-ray can be used. However, photolithography systems using short wavelengths can suffer from some disadvantages. For example, the output power of these systems can be very low due to inefficient light generation sources at these wavelengths. While expensive, the optical system of mirrors and lenses at short wavelengths can be still inefficient, absorbing most of the light output of the light generation system. Shorter wavelengths can also present a challenge in the way of stochastics and shot noise, as the energy carried by each photon at these wavelengths can be very high, so even a few less photons arriving at a target, can cause deleterious effects in the resulting photo-lithography process. Furthermore, the interactions between photoresist chemistry and light at short wavelengths can be inefficient, and in some cases, poorly understood. Finally, there are other issues with using shorter wavelength light sources in photolithography, such as lack of suitable pellicles, cooling challenges in a vacuum environment, machine costs, and other issues.

In one respect, the diffraction limit in photolithography systems stems from the problem that is presented when sub-wavelength information would have to propagate with a phase velocity faster than that of light in order to circumvent the Rayleigh criterion. As a result, these systems are diffraction limited. On the other hand, objects and light sources, being finite in size, they can propagate sub-wavelength information in the form of evanescent waves. In practice, the evanescent waves can decay in strength exponentially, as they move away from an object. Nonetheless, since they can convey sub-wavelength information, evanescent waves can be good candidates in photolithography systems for achieving better resolutions than diffraction limited systems would otherwise allow. In other words, Rayleigh's criterion can be circumvented if subwavelength information can be patterned on a mask or directly written into a photoresist material, thereby achieving resolutions better than those offered by diffraction limited photolithography systems.

Some existing techniques in photolithography can use evanescent waves, but only by operating in the near-field proximity of an object. In these techniques, near-field operation can be due to losses in superlenses used in these techniques, along with the natural decay in the strength of the evanescent waves as one moves away from an object. However, having to operate photolithography equipment in the near-field of a photomask or photoresist material, as some existing techniques require, can introduce challenges. For example, in some near-field techniques the tip of a probe is placed within a wavelength distance of a sample. This can introduce technical challenges and complications, which can limit the use of evanescent waves in photolithography.

One method to convert weak evanescent waves into propagating waves is to use resonant metalenses. Using resonant effects arising from sub-wavelength spacing in resonant metalenses, evanescent waves can be converted to propagating waves. In the microwave regime, this technique can achieve focusing as much as $\lambda/25$ and imaging as small as $\lambda/80$, which are well-beyond the conventional diffraction limit. While resonant metalenses can be built to handle optical frequencies, they are more difficult to manufacture since small process and manufacture variations can destroy the capability of the resonant metalenses to deterministically focus.

Other sub-diffraction limit photolithography techniques can include photonic nano jets, near-field plasmonic-based techniques and super-oscillations. However, these techniques also can suffer from the requirement to act in the near-field regime and/or produce low power outputs that can become challenging to use in photolithography.

A phenomenon that can occur when subwavelength light sources are used in photolithography, is subwavelength scattering. Disordered subwavelength scattering can be used to improve the resolution of photolithography systems. In one respect, a resonant metalens can be interpreted as a medium in which the resonance wavelength is less than that of the light. Subwavelength scattering can be considered a disordered resonant metalens, which can be used for the conversion of evanescent waves to propagating waves. In other words, a disorder function F(x) can be defined as Equation 2.

$$F(\text{resonant\_metalens}) = \text{scattering\_medium} \qquad \text{Equation 2}$$

Therefore, inversion of the disorder function F(x), can recover a resonant metalens focusing, without the need for complex fabrication of an ideal or perfect resonant metalens. In practice, F(x) can be well approximated by a single, linear distortion matrix in either the frequency, spatial or basis domains. The disorder function F(x) or its inverse can also be approximated by a tensor and/or nonlinear analysis. Additionally, the distortion function F(x) or its inverse (e.g., in the form of a matrix and/or tensor parameters) can be in whole or in part generated and/or learned via machine learning algorithms and techniques and/or learned using stochastic search (e.g., by Metropolis-Hastings). This can enable very low-cost and simple scattering media (e.g., white paint) to be used, in order to recover a resonant metalens focusing. The described embodiments can utilize a scattering medium to act as a disordered resonant metalens which can convert evanescent waves into propagating waves and therefore can achieve sub-diffraction limit focusing and resolution. For example, in some embodiments, a scattering medium is used to scatter light and one or more wave-front shaping modules are used to compensate for the scattering effect and to achieve sub-diffraction limit resolution. Example wave-front modules, which can be used, include holographic mask, a normal mask, a digital micromirror device, a spatial light modulator, and others. Additionally, in some embodiments, the described systems and methods can be deployed with direct writing and mask-based writing techniques.

Direct Writing

FIG. 1A illustrates a scattering photolithography system 100, which can be utilized in combination with a direct writing technique to fabricate integrated circuits on a silicon wafer with a resolution higher than diffraction-limited systems. The system 100 includes a computer 102 for managing the operations of the scattering photolithography system 100. The computer 102 can include components, such as processor, long term storage, such as hard disk drive (HDD), short term memory, such as random-access-memory (RAM), input/output (I/O) devices and wireless or wired communication interfaces to connect with and manage the operations of the components of the scattering photolithography system 100. In one embodiment, the system 100 includes a photolithography chamber 104, which can house the components of the system 100 and provide electrical or mechanical interfaces to the computer 102 for managing the operations of the various components therein. A light source 106 can generate light of wavelengths that are appropriate for photolithography. In some embodiments, an example light source 106 can be a laser generator, such as an excimer laser, but other laser sources and wavelengths can also be used.

The system 100 can also include a digital mirror device (DMD) 108 which can reflect the light emitted from light source 106 onto a condensing lens 110. In some embodiments, the DMD 108 can receive image data 118 containing a pattern of ICs to be fabricated on a silicon wafer 116 and reflect light according to the image data 118 and the pattern of ICs to be fabricated. The condensing lens 110 focuses the light onto a scattering medium 112. The scattering medium 112 can be any non-transparent scattering object with a disordered internal structure. The disordered internal structure of the scattering medium 112 randomizes the direction and position of the received light rays as they travel through the scattering medium 112. In one respect, the scattering medium 112 allows focusing of light on an object that is outside a conventional lens's field of focus. In some embodiments, a surface painted with white paint can be used as the scattering medium 112.

The scattered light rays are received by a wave-front shaping module 114, which can be configured to compensate for the disordered light rays and output light rays with recovered focus. The recovered focus can be a sub-diffraction limit focus. The wave-front shaping module 114 can be a spatial light modulator, which can shape the wave-front of the light that impinges on the condensing lens 110. The surface area of the light modulator can include an array of segments (e.g., square or circular in shape), which can be phase-modulated and controlled by a learning feedback algorithm. The algorithm can adjust the relative phases of the segments and/or their positions so that the transmitted light through the wave-front shaping module 114 can interfere constructively in a chosen target on the silicon wafer 116, thereby creating a focus at a desired location on the silicon wafer 116. The focus can be a sub-diffraction limit focus with high resolution. The wave-front shaping module 114 can be deployed using a variety of mechanisms, such as a holographic mask, a digital micrometer device, a spatial light modulator, or any other mechanism to compensate for the scattering effect and to achieve sub-diffraction limit resolution.

An advantage of the described systems and methods in combination with direct writing mechanism is that it they are mask-less, thereby removing the need for expensive and fragile masks, as well as improving flexibility and spin time. In comparison to electron-beam lithography, the laser beams used in the system 100 have no intrinsic electrical charge. Therefore, multiple beams can be used simultaneously, or multiple beams can be added, without introducing the complexity of Coulomb interactions.

Figure 1B:
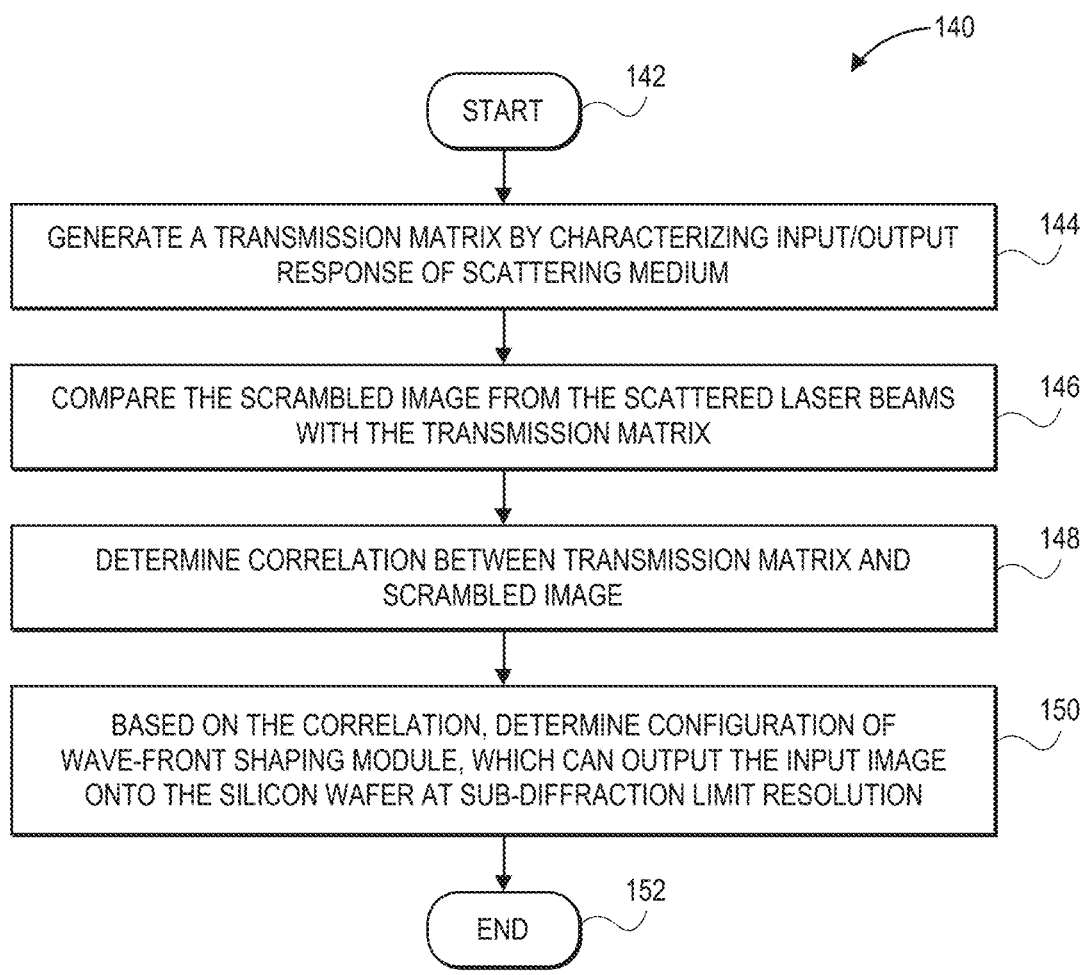
FIG. 1B illustrates a method of configuring a wave-front shaping module to use the scattered laser beams outputted from the scattering medium in order to focus a beam of light on the silicon wafer with sub-diffraction limit focusing and a high resolution.

FIG. 1B illustrates a method 140 of configuring the wave-front shaping module 114 to use the scattered laser beams outputted from the scattering medium 112 in order to focus a beam of light on the silicon wafer 116 with sub-diffraction limit focusing and a high resolution. The method starts at the step 142. At step 144, a transmission matrix is generated by characterizing an input/output response of the scattering medium, relative to the input images 118. In one embodiment, the scattering medium 112 can be illuminated with a laser beam and output images from the output of the scattering medium 112 can be recorded. At step 146, the scattered output images can be compared against the transmission matrix. At step 148, a correlation between the transmission output matrix and the scrambled images can be determined. At step 150, based on the determined correlation, a configuration of the wave-front shaping module 114 can be determined. The configuration of the wave-front shaping module 114 can position the wave-front shaping module 114 to receive scattered laser beams outputted from the scattering medium 112 and output a sub-diffraction-limit focused beam on the silicon wafer 116. The method ends at step 152. In embodiments, where the wave-front shaping module 114 is implemented with a light modulator, surface areas of phase-modulated, segments can be positioned and repositioned based on a feedback learning algorithm that adjusts the positioning and/or the phase of the segments until the wave-front shaping module 114 can focus the input image 118 on the surface of the silicon wafer 116 at desired resolution. As described earlier, the focus can be at a resolution higher than resolutions achieved by diffraction-limited systems.

Mask-Based Writing

Figure 2:
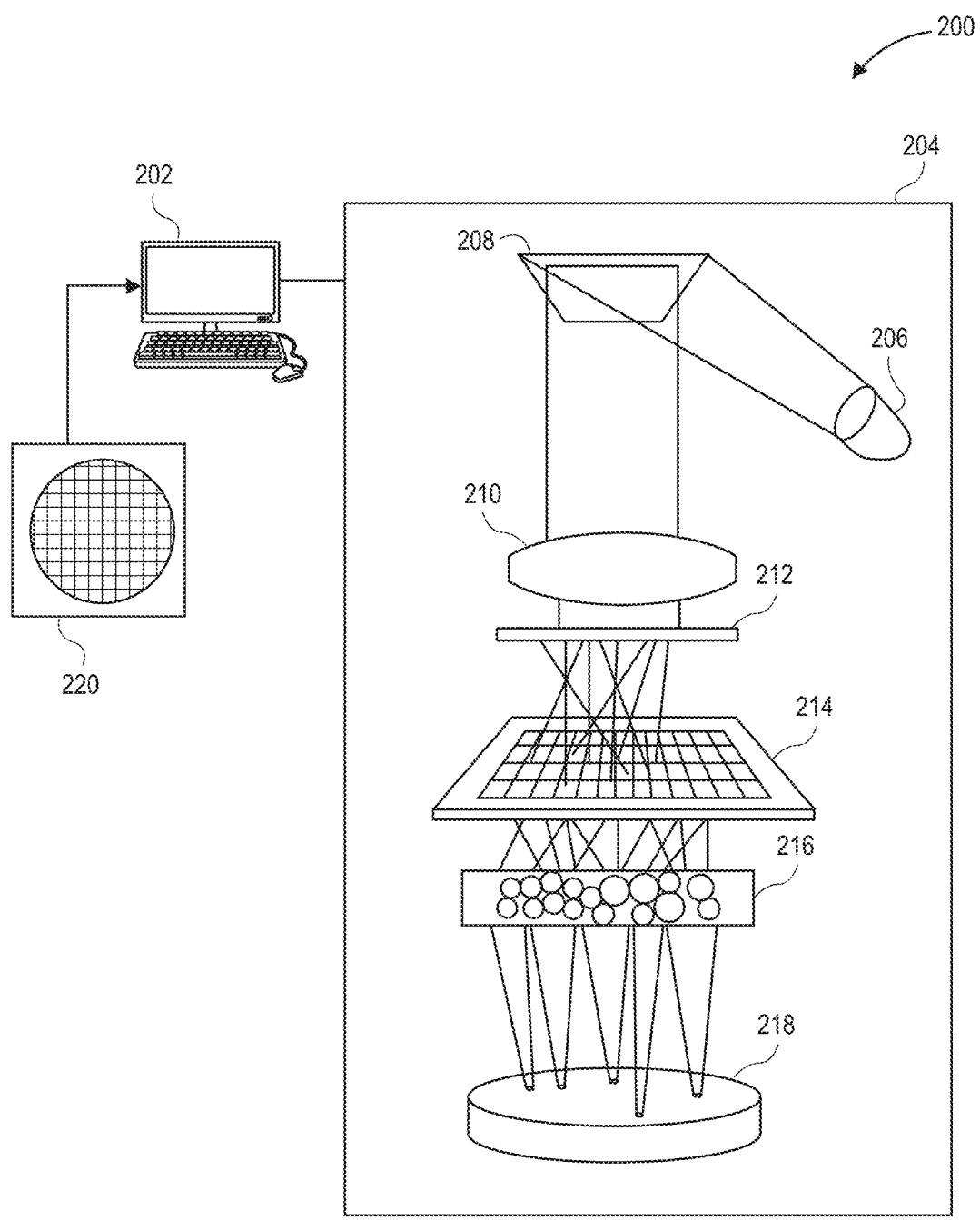
FIG. 2 illustrates a scattering photolithography system, which can be utilized in combination with mask-based writing techniques to fabricate integrated circuits on a silicon wafer with a resolution higher than diffraction-limited systems.

FIG. 2 illustrates a scattering photolithography system 200, which can be utilized in combination with mask-based writing techniques to fabricate integrated circuits on a silicon wafer with a resolution higher than diffraction-limited systems. While direct writing offers advantages, it can be too slow for some industrial applications, where printing multiple copies of IC patterns on silicon wafers may be desirable. System 200 utilizes a mask to facilitate faster and larger IC printing for industrial applications, while maintaining the sub-diffraction-limit resolution. A computer 202 is similar in configuration to the computer 102 as described above and can manage the operations of the system 200. It can store or receive an IC pattern input image 220, which the system 200 can pattern on a silicon wafer 218.

The system 200 can utilize a chamber 204 for housing the components of the system 200. The system 200 can include a light source 206, which can be similar in design and operation to the light source 106, as described earlier. The light source 206 can send one or more light beams to reflector(s) 208. The reflector(s) 208 reflect the light onto a condensing lens 210. The condensing lens 210 can be similar in operation and design to the condensing lens 110. The light received from the condensing lens 210 can be incident upon a scattering medium 212, with similar properties as described earlier in relation to the scattering medium 112. In one embodiment, a reticle or mask 214 can be constructed based on the input image 220 and receive the scattered light outputted from the scattering medium 212. In one embodiment, the mask 214 can include a compensation pattern, such that the scattered light incident upon the mask 214 can be focused on the silicon wafer 218. The resolution of the focus achieved in this manner can be beyond the resolution achievable by diffraction-limited photolithography systems. The compensation pattern can be determined according to the techniques described above in relation to the embodiment of FIG. 1B, and/or by using a feedback learning mechanism to tune the compensation pattern in mask 214 to achieve sub-diffraction-limit resolution on the silicon wafer 218.

In one embodiment, in lieu of or in addition to a compensation pattern embedded in the mask 214, a wave-frontshaping module 216 can be used. The wave-front shaping module 216 can be similar in operation and design to the properties of the wave-front shaping module 114. The wave-front shaping module 216 can be configured using techniques similar to those described above in relation to the embodiment of FIG. 1B, by a learning feedback algorithm, or by a linear approximation of a distortion matrix in either frequency, spatial or basis domains.

Although photolithography using light beams will likely dominate the future of lithography for the purpose of fabricating ICs, the described embodiments can also be applied to other types of lithography, such as charged particle beams lithography, electron beam lithography and/or focused ion beam lithography. Charged particle beam scattering can be in some ways, even easier to induce than that of light, and by using the described embodiments. Charged particles can act as components analogues to optical components. For example, spatial charged particle modulators can be used to provide sub-nanometer or sub-picometer lithographic resolution. Therefore, the described embodiments can be used to build sub-picometer lithographic systems, as there is currently no sub-picometer resonant metalenses for charged particles.

The described embodiments offer several advantages. They enable immediate realization of resolutions 5-10× greater than what is currently achievable at a given wavelength, but for a lower cost. For example, even white paint can be used as the scattering medium. Similarly, wave-front shaping module is relatively inexpensive to build and use. On the other hand, current proposals for next generation lithography require substantial investment and expenditure by the industry and only promise or can achieve 2-4× greater resolution than what is otherwise available. The described systems and methods, on the other hand, in principle, have no resolution limit. Better-quality distortion compensation mechanisms and deeper subwavelength scattering structures can be used in order to achieve even greater resolutions. Just as radically, the described techniques can extend the capability of extremely low cost lithography tools such as do-it-yourself (DIY) and simple setups to achieve lithography competitive or even better than high-cost commercial tools like 193 nm immersion steppers, enabling decentralization and greatly reduced capex of advanced node semiconductor manufacturing. Finally, the described techniques are orthogonal to several other lithography enhancement techniques and can work in combination with those.

Multiphoton Photolithography

The described embodiments can be used in multiphoton photolithography. Multiphoton lithography combined with scattering lithography can yield resolutions not achievable in conventional lithography systems. The nonlinear effects in the photoresist chemistry can be used to achieve higher lithographic resolution. For example, the silicon wafers 116 or 218 can be coated with a nonlinear photoresist material that can respond to the light emitted from the light sources 106 and 206 in a manner that 3D structures can be patterned in the photoresist. This method relies on a multi-photon absorption process in a material (e.g., the nonlinear photoresist) that is transparent at some wavelength and not at others. Consequently, modulating wavelength of the laser can be used for creating patterns in the nonlinear photoresist material, which can in turn be used for creating IC patterns in the silicon wafers 116 and 218. By scanning and properly modulating the laser, a chemical change (usually polymerization) occurs at the focal spot of the laser and can be controlled to create an arbitrary three-dimensional periodic or non-periodic pattern. The 3D structures patterned in the photoresist can correspond to the input images 118 or 220, such that when the silicon wafers 116 and 218 are etched with a solvent corresponding to the photoresist, a desired IC pattern is fabricated (e.g., via etching) on or in the silicon wafers 116 and 218. Other fabrication steps may also be deployed, such as chemical vapor deposition (CVD), doping and others, in addition to the described photolithography techniques, in order to fabricate an integrated circuit on the silicon wafers 116 and 218.

In multiphoton lithography, the photoresist material deposited on the silicon wafers 106 and 218 undergoes a selective polymerization due to and depending on the focused laser beams received from the mask 214, or wave-front shaping modules 114, 216 and the wavelength of the underlying laser beams. Typically, multiphoton lithography achieves polymerization on photoresist material deposited on the silicon wafers 116, 218 by using a higher intensity laser beam (e.g. by using laser beam with power intensity of squared or cubic of the power intensity used in non-multiphoton lithography). This can enable a tighter confinement (higher resolution) than may be conventionally achievable with standard diffraction-limited lithographic techniques.

Figure 3:
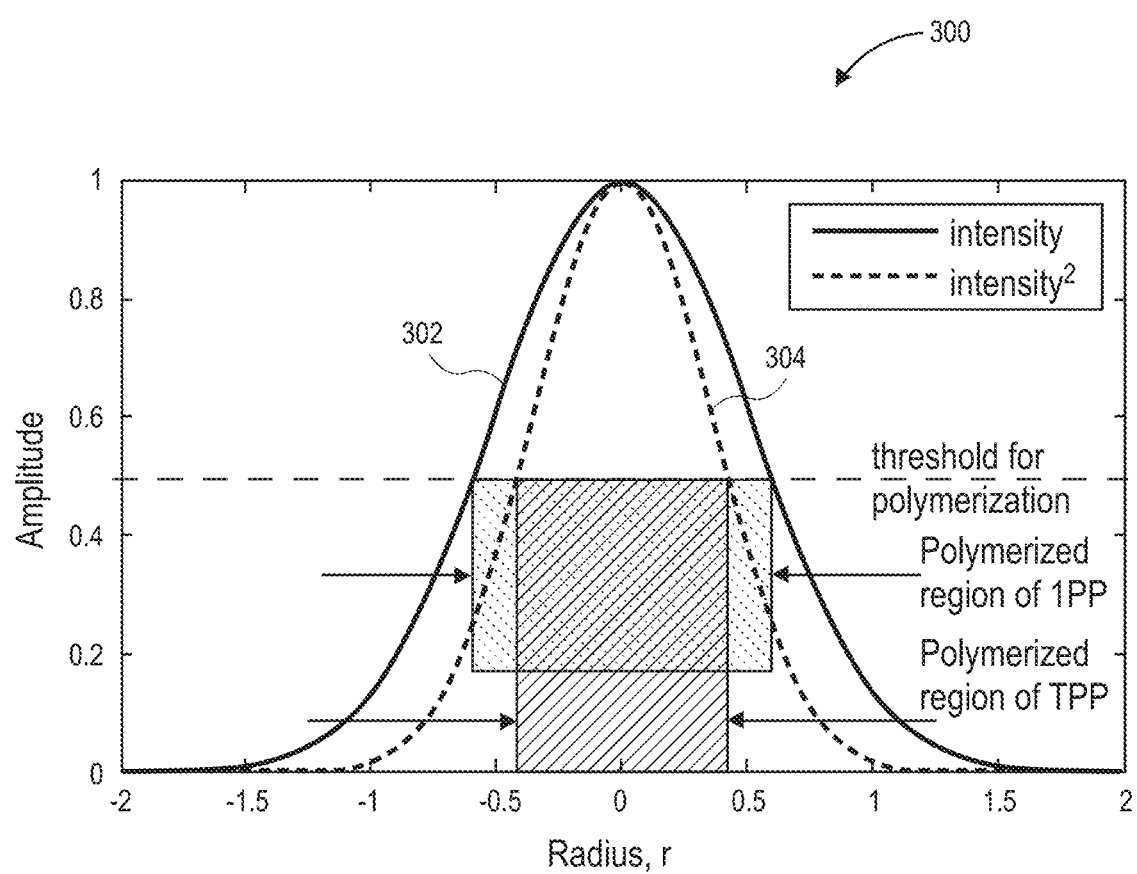
FIG. 3 illustrates a graph of amplitude of light wave used as a function of the radius of the polymerization that can be achieved.

FIG. 3 illustrates a graph 300 of amplitude of light wave used as a function of the radius of the polymerization region that can be achieved. The curve 302 illustrates a light intensity, I, used in one photon polymerization (1PP) lithography, while curve 304 illustrates intensity $I^2$ used in two photo polymerization (TPP) lithography. The radius of the polymerization region when higher intensity light is used is smaller, allowing for finer resolution to be achieved. While the graph 300 is illustrated for 1PP and TPP, the described embodiments are not so limited and can be used with any multiphoton lithography technique. Furthermore, by tightening the intensity distribution and by using scattering-based super-resolution focusing described in systems and methods above, in combination with nonlinear photoresist multiphoton lithography, higher resolutions can be achieved.

Various photoresist chemistries and corresponding light waves of the light sources 106, 206 can be used. Some example photoresist material types include, Photopolymeric, photodecomposing, photocrosslinking photoresist. Wavelengths in the ultraviolet spectrum (<400 nm) can be used, but other wavelengths of light can also be used. In addition, various photo initiators can optionally be added to the photoresist material deposited on the silicon wafers 116, 218, for example, to increase the two-photon sensitivity and/or cross-section available for polymerization, which can enable using lower cost, longer pulse-width lasers in light sources 106, 206 and/or to increase scanning speed of the laser beams from light sources 116, 218. Furthermore, as described earlier the embodiments of multiphoton lithography can be deployed with both direct writing and the mask-based writing techniques described above.

Figure 4:
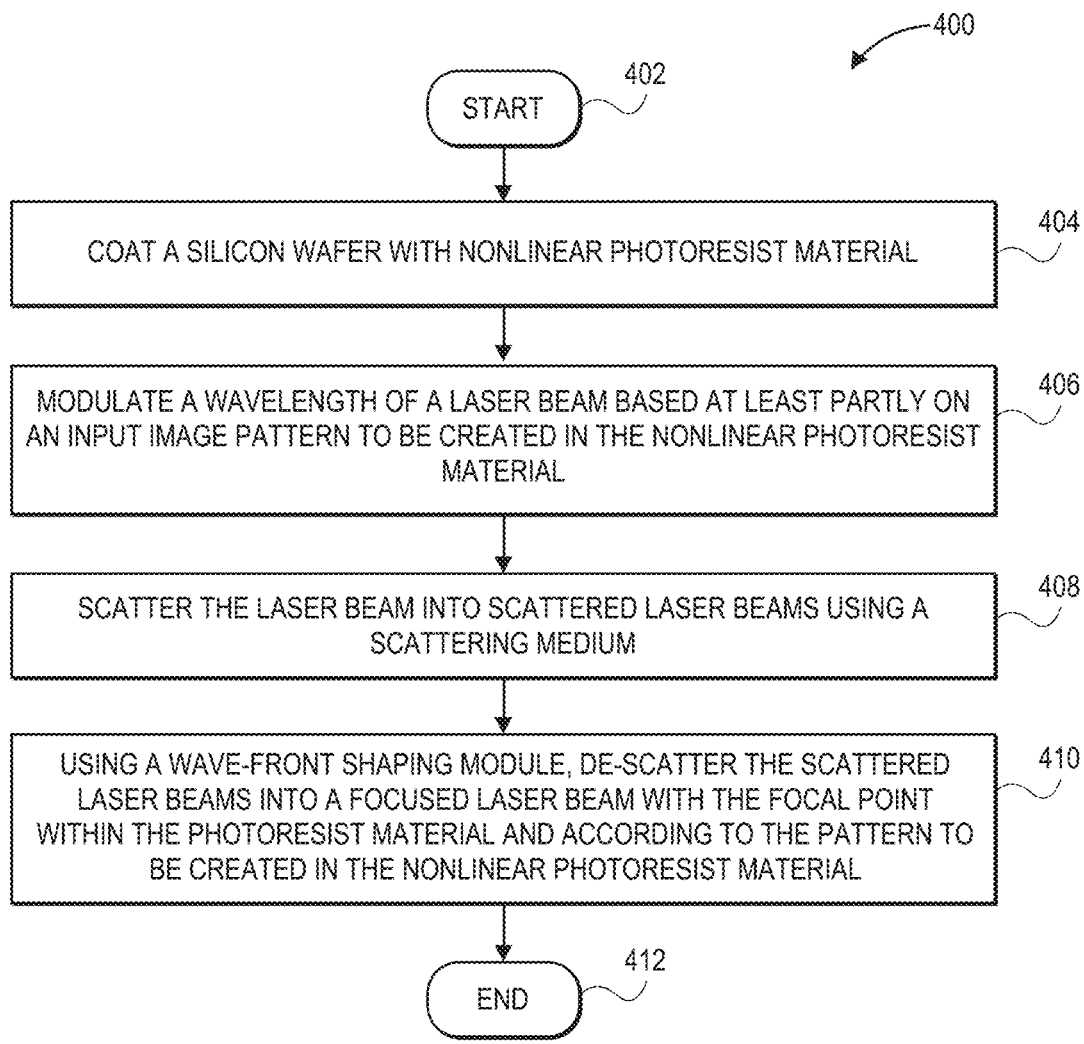
FIG. 4 illustrates a method of nonlinear scattering lithography according to an embodiment.

FIG. 4 illustrates a method 400 of nonlinear scattering lithography according to an embodiment. The method will be described in relation to the embodiment of FIG. 1 and direct writing. However, the multiphoton nonlinear scattering lithography, as described herein, is also applicable to mask-based lithography techniques, such as those described in relation to the embodiment of FIG. 2. The method starts at step 402. At step 404, the silicon wafer 116 is coated with a nonlinear photoresist material. The photoresist material can be positive-tone or negative-tone. The photoresist material is nonlinear and responds differently depending on what wavelength of laser is incident upon it, and where the laser beam is focused within the photoresist material. For some wavelengths the nonlinear photoresist material is transparent. For other wavelengths, the nonlinear photoresist material undergoes polymerization. The laser beam incident upon the photoresist material can be scanned throughout the photoresist material and its wavelength modulated to create a pattern within the photoresist material. The pattern is at least partially based on the input image 118 and/or how the pattern is subsequently used to fabricate an IC in or on the silicon wafer 116.

At step 406, the light source 106 can generate laser beams at various wavelengths. The input images 118 can indicate a pattern to be formed in the photoresist material. At step 406, the light source 106 can modulate the wavelength of the laser beams it generates according to the pattern that is to be formed on or in the photoresist material. In another embodiment, the computer 102 can control and manage the modulation of the wavelengths generated by the light source 106. Additionally, the light source 106 can include a wavelength modulator to change the wavelengths of the laser beams it generates. The laser beams generated by the light source 106 is focused and incident upon the condensing lens 110. In one embodiment, the DMD 108, components therein and/or positioning and parameters of other components of the system 100, such as condensing lens 110, scattering medium 112 and wave-front shaping module 114 can be used to scan and change the focal point of the laser beam incident on or within the nonlinear photoresist material deposited on the silicon wafer 116 based on the pattern to be formed in the nonlinear photoresist material.

At step 408, the scattering medium 112 scrambles the laser beams coming from the condensing lens 110. At step 410, the wave-front shaping module 114 de-scatters the scrambled laser beams inputted from the scattering medium 114 and generates a focused laser beam with the focal point on or within the photoresist material deposited on the silicon wafer 116. The computer 102 can change the focal point within the photoresist material in order to create polymerization within the photoresist material according to the pattern that is to be formed in the photoresist material. Using the described scattering medium 112 and wave-front shaping module 114, the resulting resolution of the polymerization within the nonlinear photoresist material can exceed the resolution achievable by diffraction-limited, conventional lithography techniques. The method ends at the step 412.

The silicon wafer 116 and the patterned photoresist material thereon can subsequently be processed with various semiconductor fabrication techniques, in order to form an integrated circuit pattern in or on the silicon wafer 116. For example, solvents can be used to strip away portions of the silicon wafer 116 not covered by photoresist material. Chemical vapor deposition (CVD) can be used to deposit material on portions not covered by photoresist material. Doping may be used to bombard the silicon wafer with particles or ions in areas uncovered by the photoresist material to form conductive, non-conductive or semi-conductive transistor regions. An appropriate solvent may be used to strip away the nonlinear photoresist material when it is no longer needed. Other semiconductor fabrication techniques may also be used as needed.

Stimulated Emission Depletion (STED)-Enhanced Scattering Lithography

In one respect, scattering lithography systems and methods described herein can enable converting of evanescent waves to propagating waves and thereby achieving higher lithographic resolutions (e.g., sub-diffraction) by utilizing the information embedded in the evanescent waves. Consequently, the described systems and methods can be combined and used with a variety of lithography systems. In one embodiment, the described systems and methods can be combined with stimulated emission depletion (STED) lithography and/or they can be combined with STED-enhanced multiphoton lithography. STED lithography can be used along with point-spread function (PSF) engineering to achieve higher resolutions than is available with conventional lithographic techniques.

STED can be used for super resolution far-field manufacturing. For example, the resolution using STED-enhanced lithographic systems can overcome the diffraction limitation. If the fluorescence in the outer rim of the diffraction-limited point spread function (PSF) of an excitation beam can be switched off quickly enough so that the outer fluorophores cannot emit a photon, the inner fluorophore can display a sub-Abbe resolution imaging. This turn-off can be realized by stimulated emission.

In some embodiments, the fluorophores can be excited by a laser beam. Then a donut-shaped depletion laser beam with a longer wavelength can be used to de-excite the peripheral fluorescence through stimulated emission. Under this effect, fluorescence emission from the sub-diffraction-limited center is left out to be transmitted onto a material (e.g., photoresist, nonlinear photoresist, a manufacturing substrate, etc.) to manufacture a structure or fabricate a pattern.

Figure 5A:
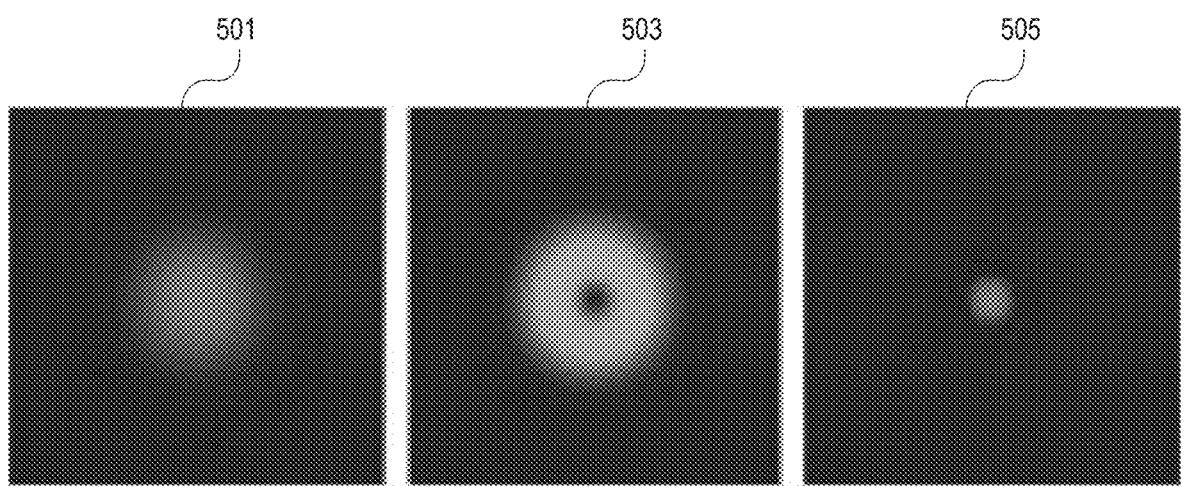
FIG. 5A illustrates a diffraction limited Gaussian spot, a donut laser beam and the resulting effective illumination spot from the combination.

FIG. 5A illustrates that the combination of a diffraction limited Gaussian spot 501 and a donut laser beam 503 can result in an effective illumination spot 505 that is significantly smaller than the diffraction limit of the optical system used to generate 501 and 503.

Figure 5B:
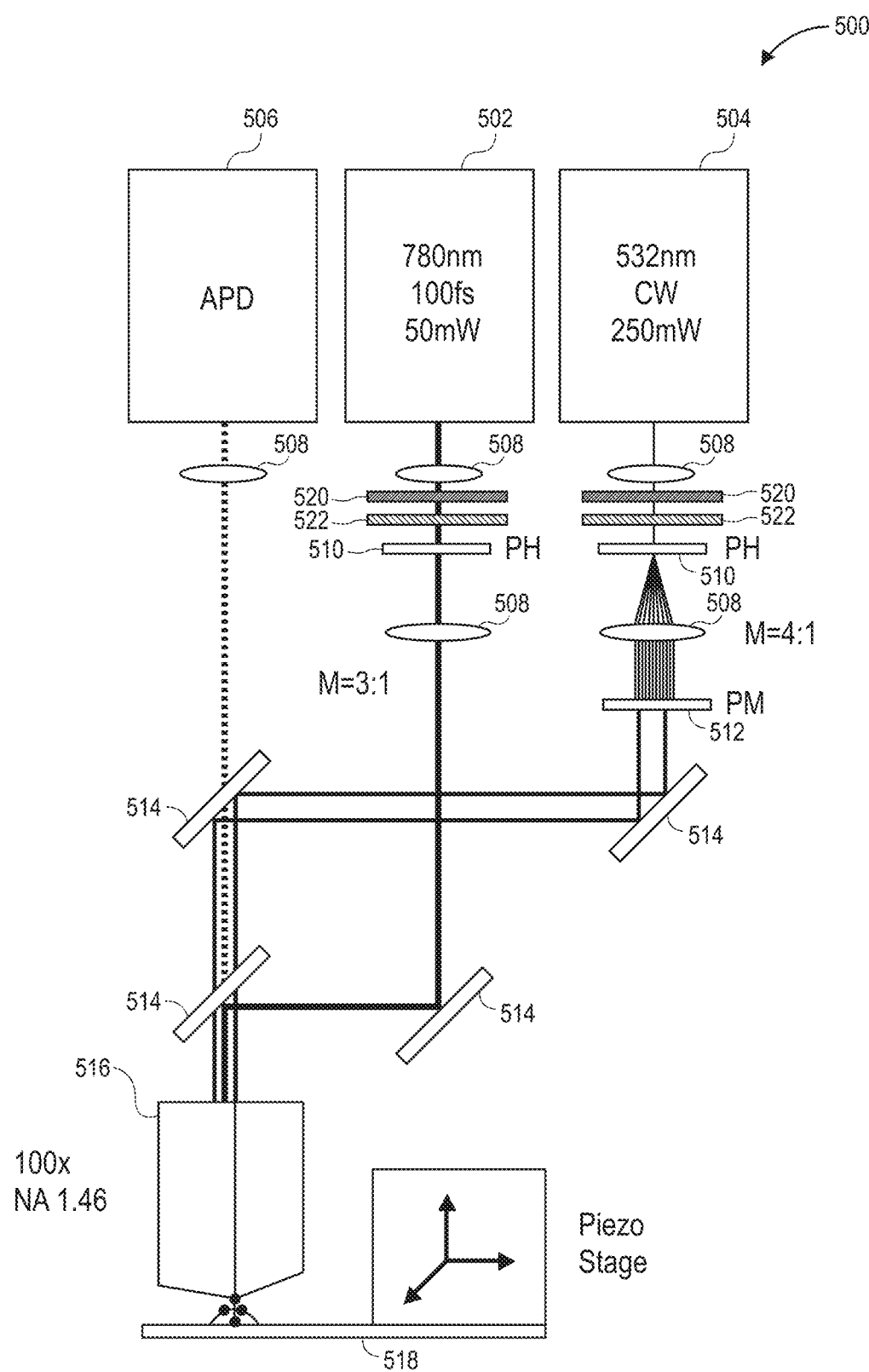
FIG. 5B illustrates a diagram of a stimulated emission depletion (STED) scattering lithography system according to an embodiment.

FIG. 5B illustrates a diagram of a STED scattering lithography system 500 according to an embodiment. The system 500 includes an excitation light source 502, a depletion light source 504, an avalanche photodiode (APD) 506, one or more condensation lenses 508, one or more pinholes 510, a phase plate (PM) 512, one or more mirrors 514, a numerical aperture (NA) device 516 and a Piezo stage 518. The excitation light source 502 can be configured to generate excitation laser beams. As an example, in one embodiment, the excitation light source 502 can generate laser beams of wavelength of 780 nanometer (nm), at 100 femto seconds (fs) at power of 50 milli Watts (mW). The depletion light source 504 can be configured to generate depletion laser beams. As an example, in one embodiment, the depletion light source 504 can generate laser beams of wavelength of 532 nm of continuous wave (CW) at power of 250 mW. Other configurations of the excitation and depletion laser beams are also possible depending on the implementation. The laser beams generated from the excitation and depletion light sources 502 and 504 can be condensed, focused, and/or routed using one or more condensation lenses 508 to one or more pinholes 510. Pinholes 510 can be used for mode purification. Example diameter ratios M of the pinholes 510 can include M=3:1 for the laser beams received from the excitation light source 502 and M=4:1 for the laser beams received from the depletion light source 504.

The depletion laser beams generated from the depletion light source 504 and routed through a pinhole 510 can be received by a a spiral phase plate (PM) 512 to generate a donut beam (e.g., the donut laser beam 503, as shown in FIG. 5A). The laser beams from the excitation light source 502, depletion light source 504 can be routed via a plurality of mirrors 514. The mirrors 514 can include deformable (DM) mirrors, dichroic (DC) mirrors, or other mirrors used in lithography. In some embodiments, one or more mirrors 514 allow some wavelengths of light to pass through them and reflect others or reflect others with a deflection. The laser beams along with a signal from the APD 506 are received via the NA device 516 and are focused on a substrate secured on a Piezo stage 518. The signal received from the APD 506 can be used to align the foci from the two constituent laser beams of the light sources 502 and 504, where the NA device 516 can generate an illumination spot or focused laser beam, such as the illumination spot 505 (of FIG. 5A) on the stage 518. In one embodiment, the Piezo stage 518 can be a multiaxis stage, which can move a manufacturing or fabrication target along various axes. In one embodiment, the NA device 516 can be configured to focus receiving laser beams with a numerical aperture of 1.46 at 100× magnification. Other configurations of the NA device 516 are also possible.

The lithographic resolution of the system 500 can further be improved by including scattering lithography components, such as one or more scattering mediums 520 and one or more corresponding wave-front shaping modules 522. The structure and components of the scattering medium 520, and its corresponding wave-front shaping module 522 is similar or identical as those described earlier in relation to scattering medium 112, 212 and wave-front shaping modules 114, 216. In one embodiment, one or more constituent laser beams of the system 500 can be scattered with one or more scattering mediums 520 and subsequently descrambled with one or more corresponding wave-front shaping modules 522 to yield higher sub-diffraction limit resolutions. For example, in one embodiment, the scattering medium 520 and wave-front shaping module 522 can be implemented between a condensation lens 508 and a pinhole 510, for laser beams emitted from the excitation light source 502, as shown in FIG. 5B. An additional scattering medium 520 and a corresponding wave-front shaping module 522 can be implemented between a condensation lens 508 and a pinhole 510 for laser beams emitted from the depletion light source 504, as shown in FIG. 5B.

The scattering mediums 520 and their corresponding wave-front shaping modules 522 can be placed at various locations in the path of the laser beams emitted from light sources 502, 504, and the locations shown are for illustration purposes only. Fewer or more pairs of scattering mediums 520 and corresponding wave-front shaping modules 522 can be used to generate a focused illumination spot 505 on a stage, such as the Piezo stage 518. Additionally, for brevity of illustration, not all components of the system 500 are shown.

Figure 6:
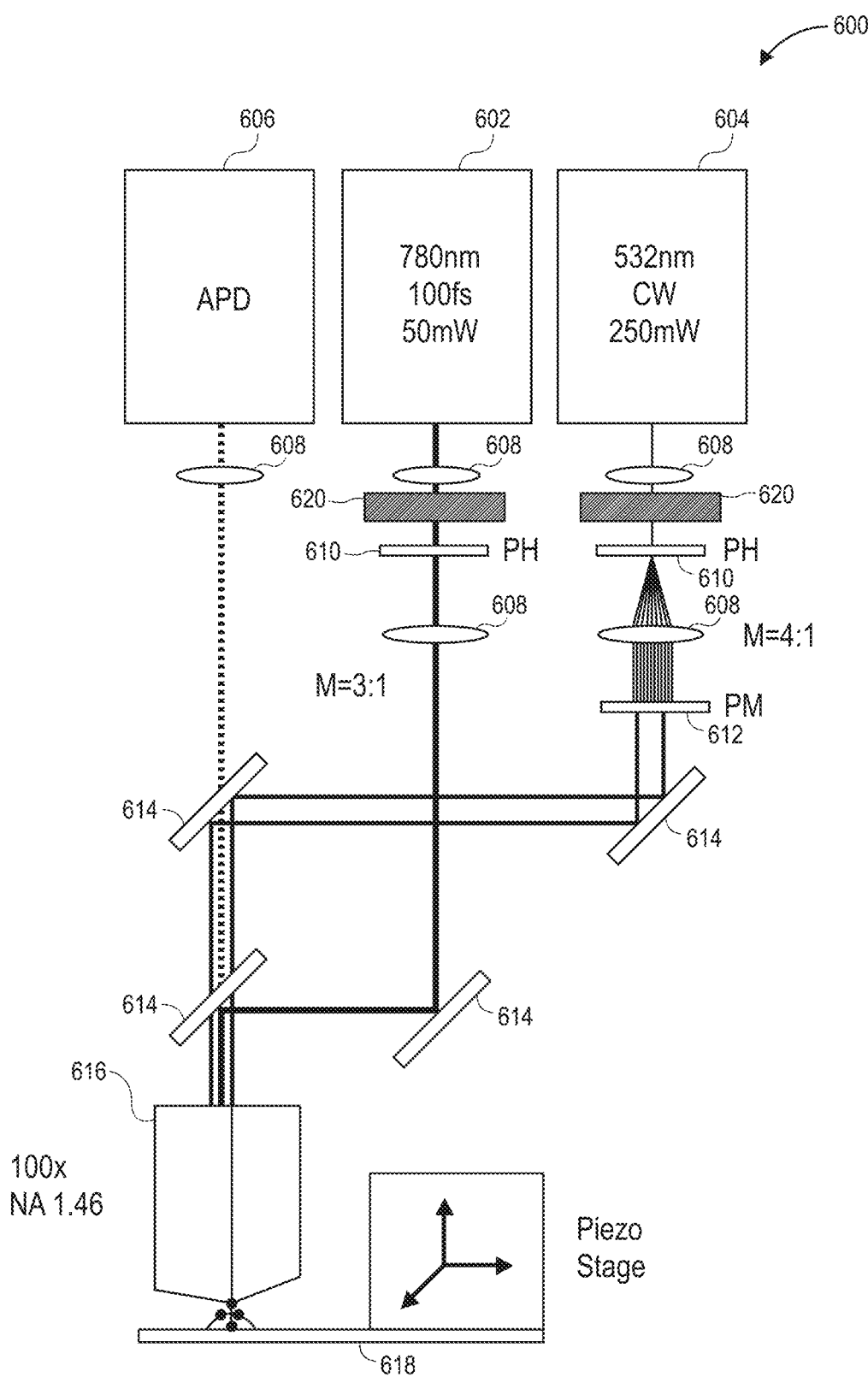
FIG. 6 illustrates a STED-enhanced scattering lithography system according to an embodiment.

The described embodiments of STED-enhanced lithography systems and methods can be used both in direct-writing and mask-based writing techniques. FIG. 6 illustrates a STED-enhanced lithography system 600, which can be used in masked-based fabrication. The system 600 includes similar or identical components, as those described in the embodiment of the system 500. For example, the system 600 can include excitation light source 602, depletion light source 604, ADP 606, condensation lenses 608, pinholes 610, phase plates (PM) 612, mirrors 614, NA device 616 and a stage 618. These components are similar or identical in their design, specification and placement as their counterparts in system 500.

The system 600 can additionally include one or more scattering lithography modules 620, which can include components such as scattering mediums, masks, reticles, wave-front shaping modules and/or a combination of these components.

Figure 7B:
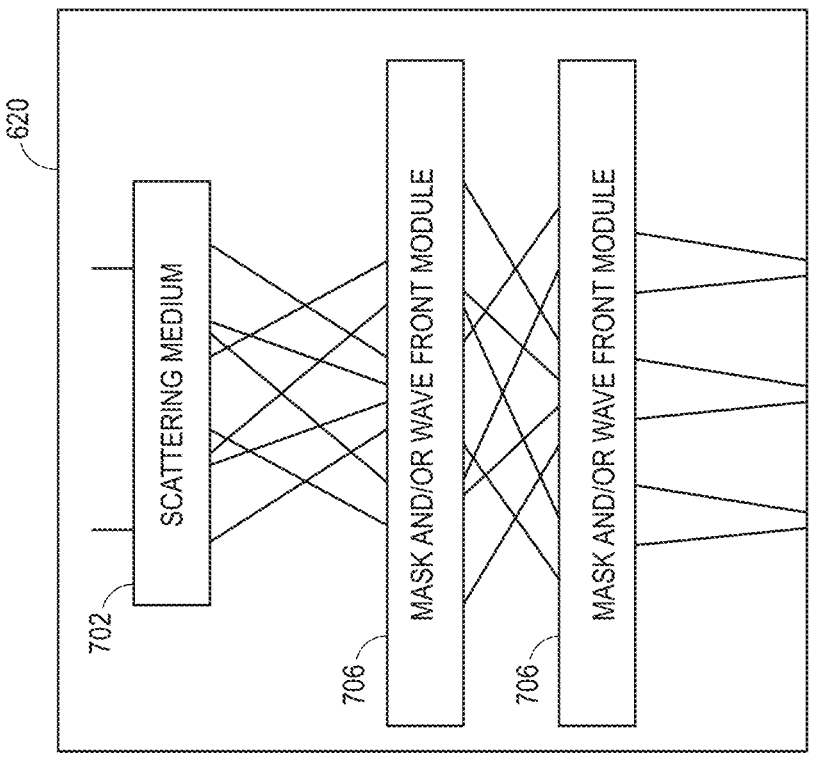
FIGS. 7A-7B illustrate a diagram of the components of the scattering lithography module of the embodiment of FIG. 6.
Figure 7A:
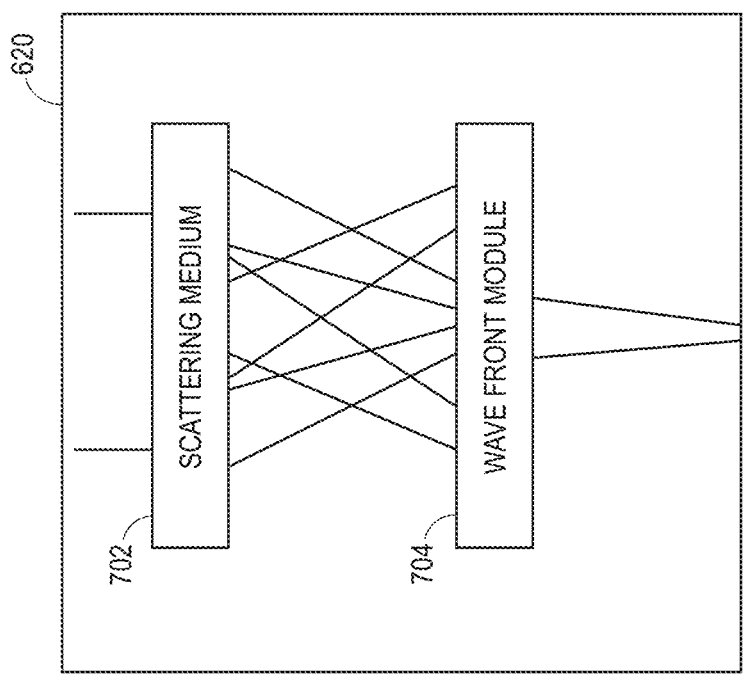

FIGS. 7A-7B illustrate a diagram of the components of the scattering lithography module 620. In FIG. 7A, the scattering lithography module 620 can include a scattering medium 702 and a corresponding wave-front shaping module 704, without a mask. The embodiment of FIG. 7A can be used in direct writing fabrication or manufacturing. The scattering medium 702 is similar or identical to the scattering mediums 112 and 212, as described above. The wave-front shaping module 704 is similar or identical to the wave-front shaping module 114, as described above, and it can be configured using the method 140, described above.

In FIG. 7B, the scattering lithography module 620 can include components, including a mask or reticle. The mask or reticle can include a pattern or template of integrated circuit or other components to be manufactured at the target of the NA device 616 on the stage 618. For example, the scattering module 620 can include a scattering medium 702 and one or more mask and/or wave-front shaping modules 706. The modules 706 can include a mask or reticle, with or without a compensation pattern relative to their corresponding scattering medium. In other words, the wave-front shaping module or compensation pattern and components therein can be integrated and embedded in a mask or they can be separate components, as is case for the embodiments of FIG. 2.

The compensation patterns or configuration of the mask and/or wave-front shaping modules 706 can be determined with a variety of techniques, including those techniques described above in relation to the embodiment of FIG. 2. For example, the modules 706 can include an array of phase-modulated segments, whose positions and phase can be adjusted via a machine learning algorithm and/or feedback algorithm in relation to the scattering medium 702, such that the descrambling of laser beams received from the scattering medium 702 can be accomplished, resulting in a sub-diffraction-limit focusing resolution. In another embodiment, the compensation patterns of the mask and/or wave-front shaping modules 706 can be determined based on input/output response function of the scattering mediums 702. For example, a processor can generate a transmission matrix based on input/output response of the scattering medium and determine a correlation between the transmission matrix and the scrambled laser beams. From the correlation, a configuration of the modules 706 can be determined, such that modules 706 can descramble the scrambled laser beams and generate focused laser beams with sub-diffraction-limit resolution. Feedback loops, machine learning, or stochastic search and methods such as Metropolis-Hastings can be employed to generate the compensation patterns of the wave-front shaping modules 706 and configure them accordingly. The resolution of the focus generated in this manner can be a sub-diffraction limit resolution, as described earlier in relation to the embodiments of FIGS. 1-4.

The mask and/or wave-front shaping modules 706 can be implemented by one or more of a holographic mask, a normal mask, a digital micrometer device, and a spatial light modulator.

The system 600 can also be used in combination with nonlinear scattering lithography, as described above. For example, when used in the context of integrated circuit fabrication. A silicon wafer deposited with non-linear photoresist material can be secured on stage 618, and the wavelengths of the laser beams generated from the excitation light source 602 and the depletion light source 604 can be modulated based on a pattern to be generated in the nonlinear photoresist material placed at the target of the NA device 616.

The described systems and methods can be deployed with STED-enhanced multiphoton lithography. In three-dimensional optical lithography, cross-linked polymers are formed via multiphoton-induced polymerization by focusing an ultrashort pulsed laser into an acrylate monomer mixed with a photoinitiator. In STED-enhanced multiphoton lithography, a second laser locally inhibits the ability of the photoinitiator to start the polymerization in the outer rim of the point spread function (PSF). The polymerization volume is thus confined, which allows for structuring of nanometer-sized features. STED-enhanced lithography augmented with scattering lithography can be used in combination with Mercapto-functional polymers to improve yield and mechanical stability of three-dimensional fabrication of structures using the described systems. A variety of methods can be used to induce the STED-enhancement. For example, two overlapping Gaussian beams, or a "doughnut" beam and a Gaussian beam can be used. Other methods of inducing STED-enhancement, as known by persons of ordinary skill in the art, can also be used.

In one embodiment, two-photon polymerization starters are excited with 780 nm ultrashort laser pulses (FemtoRay780, 50 MHz repetition rate, 100 fs pulse duration, Menlo Systems GmbH, Germany) and are locally depleted in the outer rim of the point spread function with a depletion beam (532 nm, continuous wave, Verdi-V5, Coherent, U.S.A.). The 532 nm depletion beam was shaped into a donut form using a $2\pi$ spiral phase mask (RPC Photonics, U.S.A.) and a $\lambda/4$ plate converting the depletion beam into a circularly polarized beam. Both beams are focused through an oil immersion objective lens (Zeiss $\alpha$-plan Apochromat, 100×, numerical aperture NA=1.46). Power adjustment of the excitation beam are provided by an acousto-optic modulator (Q1133, Isomet, U.S.A.). An avalanche photo diode (APD-SPCM-AQRH, PerkinElmer Optoelectronic Inc., U.S.A.) is used for aligning the foci. A three axes piezo stage (P562.3CD, Physik Instrumente PI, Germany) with a bidirectional positioning accuracy of 2/2/4 nm and a travel range of 200×200×200 µm, is used for sample motion. The high-precision stage is mounted on top of a coarse x-y motor stage (M-686.D64, Physik Instrumente PI, Germany) with a travel range of 25×25 mm. The stages are driven in closed loop with two controllers (E710.3CD and C-867.260, both from Physik Instrumente PI, Germany). For sample positioning, recording of images and controlling the writing process, a LabView (LabView 2011, National Instruments Corporation, U.S.A.) program is used. The given measurements and components are provided as example implementations of the described embodiments and are not the only possible measurements and components. Persons of ordinary skill in the art can envision other implementations, without departure from the spirit of the disclosed technology.

Figure 8:
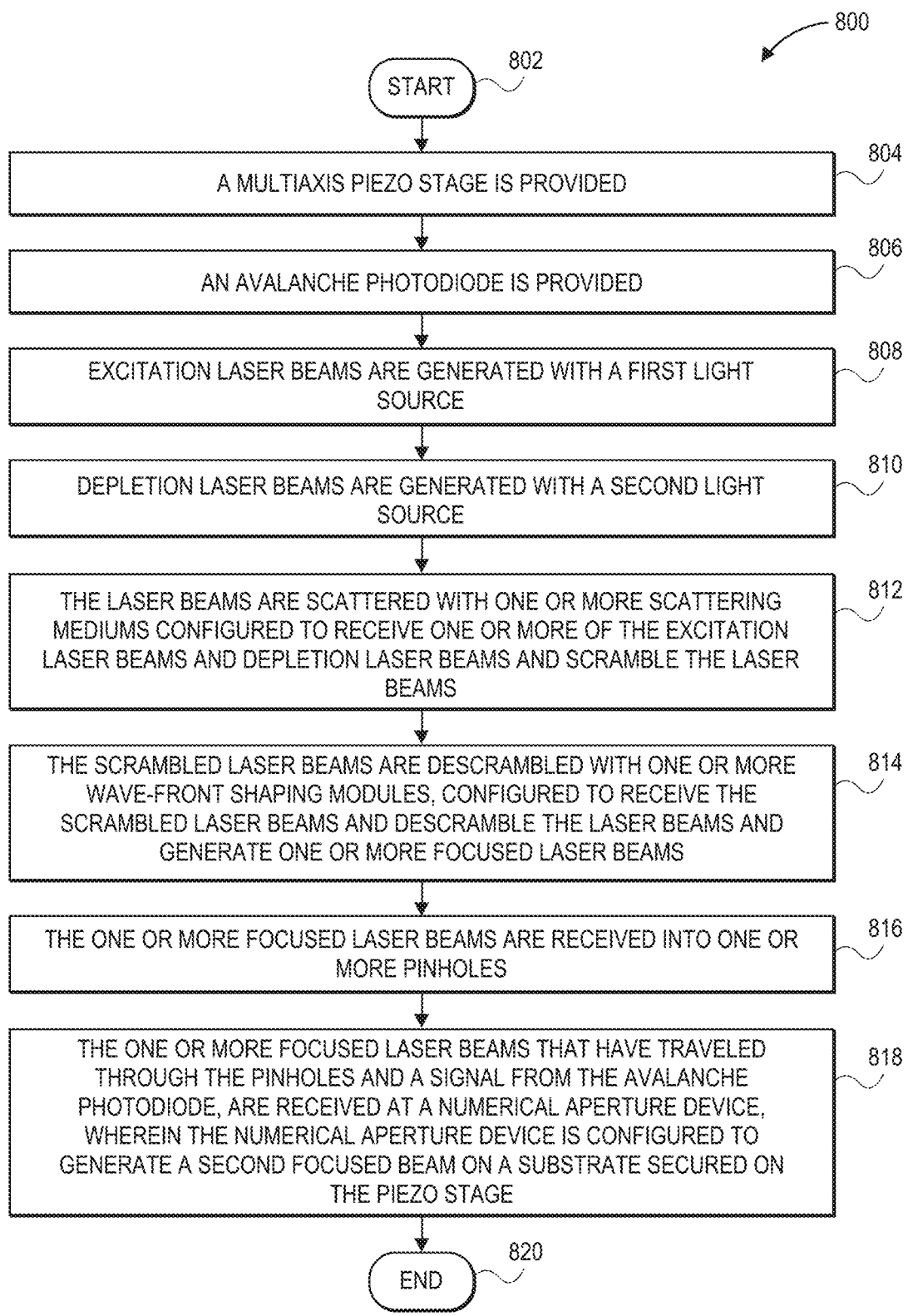
FIG. 8 illustrates a lithography method according to an embodiment.

FIG. 8 illustrates a lithography method 800 according to an embodiment. The method 800 starts at step 802. At step 804, a multiaxis Piezo stage is provided. At step 806, an avalanche photodiode is provided. At step 808, excitation laser beams are generated with a first light source. At step 810, depletion laser beams are generated with a second light source. At step 812, the laser beams are scattered with one or more scattering mediums configured to receive one or more of the excitation laser beams and depletion laser beams and scramble the laser beams. At step 814, the scrambled laser beams are descrambled with one or more wave-front shaping modules, configured to receive the scrambled laser beams and descramble the laser beams and generate one or more focused laser beams. At step 816, the one or more focused laser beams are received into one or more pinholes. At step 818, the one or more focused laser beams that have traveled through the pinholes and a signal from the avalanche photodiode, are received at a numerical aperture device, wherein the numerical aperture device is configured to generate a second focused beam on a substrate secured on the Piezo stage. The method ends at the step 820.

Advantages

STED-lithography can enable resolutions that are significantly better than existing optical lithography techniques. Scattering lithography is an orthogonal technique which leverages the ability of scattering media to transform evanescent waves into propagating waves to achieve sub-diffraction limit far-field focusing. By utilizing scattering lithography, both constituent beams of STED-lithography can be focused beyond the conventional diffraction limit. Since STED-lithography is a PSF-engineering technique, the scattering-enhanced reduced PSF can be further reduced by STED-lithography techniques, resulting in greatly increased resolution.

The resolution achievable with conventional STED-lithography is on the order of approximately 55 nm. With the enhancement effect of approximately 10× with the disclosed embodiments of scattering lithography, lithographic resolutions as low as approximately 5.5 nm can be achieved, with opportunities to improve even beyond that. Such low resolutions would not be achievable even by extremely expensive EUV lithography machines. Instead, to achieve such high resolutions, the use of charged particle beams would be required, which can be extremely slow. The described systems and methods enable the opportunity to improve quite dramatically resolutions achievable by existing lithographic techniques even further. For example, two axes of improvements can be achievable: STED and scattering. While STED-microscopy has been used in some cases to achieve resolutions as low as 4 nm, the application of the disclosed systems and methods to lithography can result in even greater jumps in the lithographic resolution. For example, with 4 nm STED-lithography, scattering STED-lithography can achieve lithographic resolutions as low as 400 picometers, which is near the silicon lattice limit.

For two-photon polymerization lithography, off-the-shelf TPP lithography systems can achieve resolutions on the order of approximately 100 nm. The embodiments of scattering lithography can tighten the intensity distribution by a factor of at least ~10×, which can enable lithographic resolution of around approximately 10 nm. This is a substantial improvement over existing lithography systems and techniques. Existing lithography techniques cannot achieve this improvement in resolution even by using extreme ultraviolet (EUV). Despite huge costs and substantial trade-offs, existing lithography technology cannot achieve the resolutions that are possible using the described embodiments.

Furthermore, the embodiments of multiphoton lithography can achieve their high resolution at a lower cost. When a 193 nm laser is used in conventional lithography, while inefficient, large and expensive, resolutions on the order of 193/20 or ~10 nm can be achieved. By contrast, with the embodiments of nonlinear scattering lithography, can achieve the same resolution by using shorter wavelength lasers, which can make the overall systems 100 and 200 substantially less expensive. For example, embodiments of nonlinear scattering lithography can use 100 nm lasers, achieving resolution of 100/10 9 or ~10 nm, at costs orders of magnitude lower and with greatly increased efficiency.

While the embodiments are described in relation to fabricating an integrated circuit on the silicon wafers 116 and 218, the applications of the described systems and methods are not so limited and can be applied for fabrication on any free-standing structure. For example, fabrication on any structure capable of deposition of photoresist material can use the described systems and methods.

Alternative Embodiments

Figure 9:
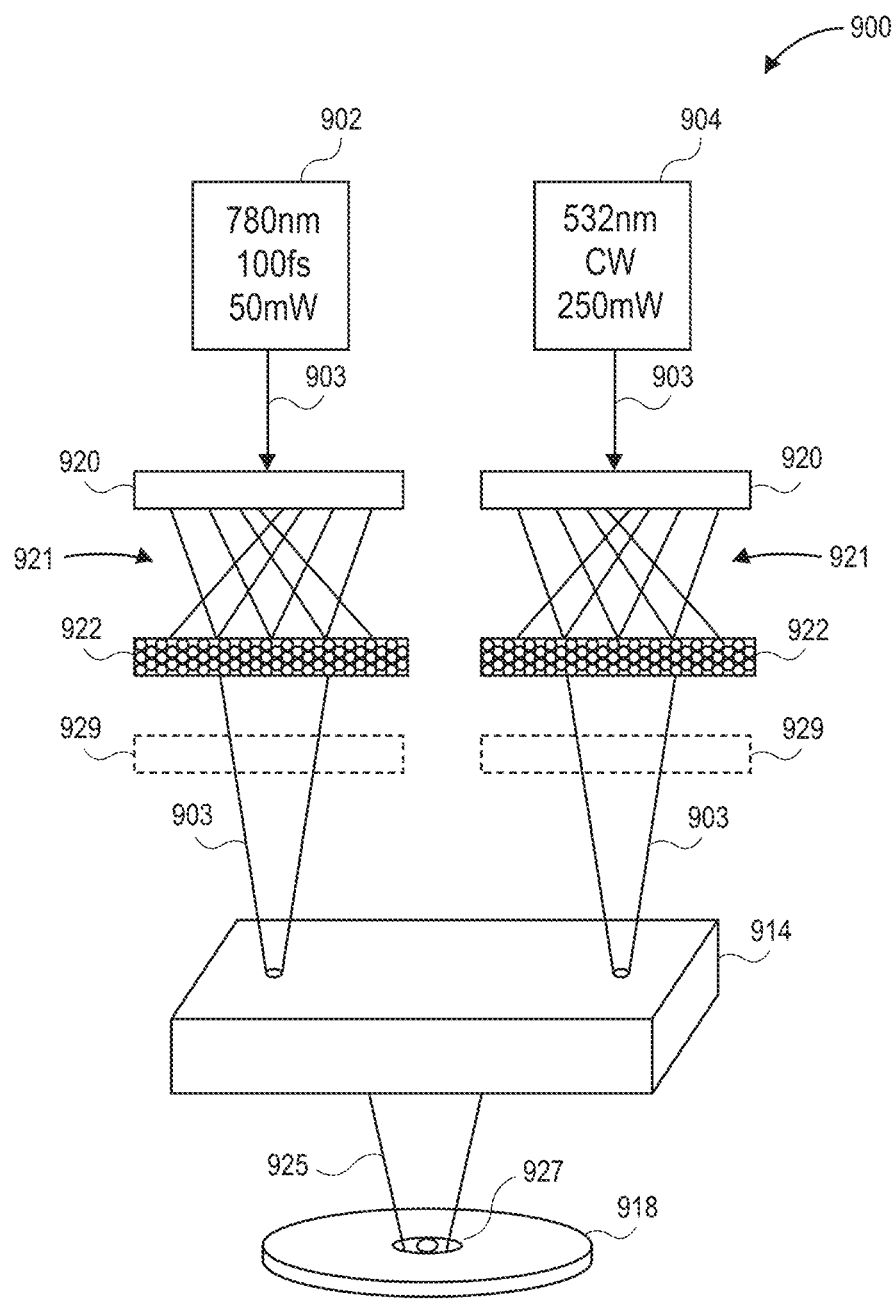
FIG. 9 illustrates a diagram of a STED-enhanced scattering lithography system according to an embodiment.

Not every implementation of the described embodiments requires the use of APD 506, 606 or stage 518. FIG. 9 illustrates a STED-enhanced scattering lithography system 900 according to an embodiment. The system 900 includes a first STED constituent light source 902 (similar in configuration and set up to the light source 502) and a second STED constituent light source 904 (similar in configuration and set up to the light source 504). The emitted light rays 903 from the first and/or second STED constituent light sources 902, 904 can be scrambled or scattered, using one or more scattering mediums 920. The scattering mediums 920 are similar in configuration and setup to the scattering mediums 520, 620, as described above. The scattering mediums 920 can generate scrambled light rays (e.g., laser light) 921.

The scrambled light rays 921 can be received by one or more wave-front shaping modules 922. The wave-front shaping modules 922 are similar in configuration and setup to the wave-front shaping modules 510, 610, as described above. The wave-front shaping modules 922 can receive the scrambled light rays 921, descramble them and generate descrambled light rays 923, which have a sub-diffraction limit resolution. The descrambled light rays 923 can be received by a routing module 914, which can comprise components to route and focus the descrambled light rays 923 on a substrate 918, generating an effective illumination spot 927 on the substrate 918. The effective illumination spot 927 can be significantly smaller than the optical diffraction limit of the system 900 had no scrambling and descrambling operations were performed. an optical system lacking the features of the system The routing module 914 can include components such as mirrors, lenses, NA devices and any other components, as persons of ordinary skill in the art can envision, to route and focus the descrambled light rays 923 into an effective illumination spot on the substrate 918. The effective illumination spot 927 can be used to generate chemical reactions in a linear or nonlinear photoresist material or be used in direct writing to fabricate 3D structures in or on the substrate 918. The effective illumination spot 927 can be used for causing polymerization or other chemical reactions to generate manufacturing patterns for building ICs or other nano structures. System 900 can be used both in direct writing and mask-based fabrication techniques. For example, the wave-front shaping module can include a patterned mask to mirror that pattern into the effective illumination spot 927 and into a material in or on the substrate 918. In another embodiment, a mask 929 can be a separate component than the wave-front shaping module 922. Still in other embodiments, a combination of integrated masks in the wave-front shaping module 922 and separate mask components 929 can be used.

Figure 10:
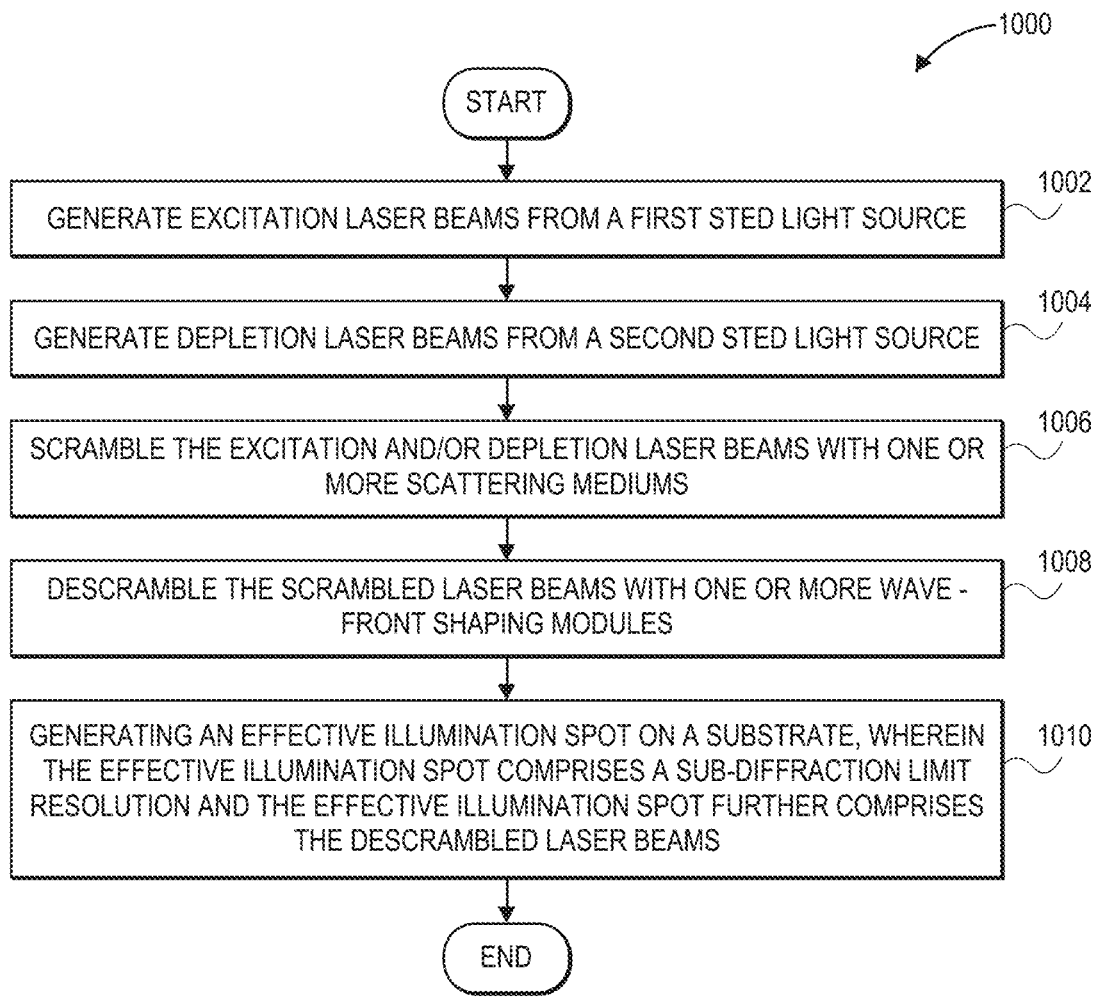
FIG. 10 illustrates a method of the operation of the embodiment of FIG. 9 or any other STED-enhanced lithography system.

FIG. 10 illustrates a method 1000 of the operation of the system 900 or a STED-enhanced lithography system. At step 1002, the method includes generating excitation laser beams from a first STED light source. At step 1004, the method includes generating depletion laser beams from a second STED light source. At step 1006, the method includes scrambling the excitation and depletion laser beams with one or more scattering mediums. At step 1008, the method includes descrambling the scrambled laser beams with one or more wave-front shaping modules. At step 1010, the method includes generating an effective illumination spot on a substrate, wherein the effective illumination spot comprises a sub-diffraction limit resolution and the effective illumination spot further comprises the descrambled laser beams.

It is noted that in some embodiments, only one of the constituent light beams of the STED is scrambled and later descrambled. It is not necessary, in every implementation of the described embodiments that both constituent light beams of STED be scrambled and descrambled.

What is claimed is:

1. A lithography system comprising:
a first light source, configured to generate excitation laser beams;
a second light source, configured to generate depletion laser beams;
one or more scattering mediums configured to receive one or more of the excitation laser beams and depletion laser beams and scramble the laser beams;
one or more wave-front shaping modules, configured to receive the scrambled laser beams, descramble the laser beams and generate one or more focused laser beams;
wherein a first scattering medium receives the excitation laser beams and a first wave front-shaping module receives respective scrambled laser beams from the first scattering medium to generate one or more first focused laser beams;
wherein a second scattering medium receives the depletion laser beams and a second wave front-shaping module receives respective scrambled laser beams from the second scattering medium to generate one or more second focused laser beams; and
a numerical aperture device configured to receive the one or more focused laser beams and generate a second focused beam on a substrate.

2. The system of claim 1, wherein the wave-front shaping module, further comprises a compensation pattern generated based at least partly on the pattern of scattering by the one or more scattering mediums, and wherein the compensation pattern is learned and generated with one or more machine learning, stochastic search, and Metropolis-Hastings.

3. The system of claim 1, further comprising a mask, wherein the mask comprises a pattern of integrated circuit devices to be fabricated on the substrate, wherein the substrate comprises a silicon wafer.

4. The system of claim 1, wherein the wave-front shaping module comprises a fabrication mask, comprising a pattern of integrated circuit devices to be fabricated on the substrate, and wherein the substrate comprises a silicon wafer.

5. The system of claim 1, wherein the wave-front shaping module comprises one or more of a holographic mask, a normal mask, a digital micrometer device, and a spatial light modulator.

6. The system of claim 1, wherein the wave-front shaping module comprises an array of phase-modulated segments, whose positions and phase can be adjusted with a learning feedback algorithm to generate the one or more focused laser beams.

7. The system of claim 1, further comprising a processor configured to:
generate a transmission matrix based on input/output response of the scattering medium;
determine a correlation between the transmission matrix and the scrambled laser beams; and
based on the correlation configure the wave-front shaping module to receive the scattered laser beams and generate the one or more focused laser beams.

8. The system of claim 1, further comprising:
nonlinear photoresist material deposited on the substrate, wherein the photoresist material undergoes polymerization depending on wavelengths of light received at the nonlinear photoresist material; and
a processor configured to selectively emit laser beams from the light sources at a plurality of wavelengths, wherein the wavelengths are chosen based at least partly on a pattern to be formed in the nonlinear photoresist material.

9. The system of claim 1, wherein the substrate comprises Mercapto-functional polymers.

10. A method of lithography comprising:
generating excitation laser beams with a first light source;
generating depletion laser beams with a second light source;
scrambling the laser beams with one or more scattering mediums configured to receive one or more of the excitation laser beams and depletion laser beams and scramble the laser beams;
descrambling the scrambled laser beams with one or more wave-front shaping modules, configured to receive the scrambled laser beams and descramble the laser beams and generate one or more focused laser beams; wherein a first scattering medium receives the excitation laser beams and a first wave front-shaping module receives respective scrambled laser beams from the first scattering medium to generate one or more first focused laser beams; wherein a second scattering medium receives the depletion laser beams and a second wave front-shaping module receives respective scrambled laser beams from the second scattering medium to generate one or more second focused laser beams; and
receiving the one or more focused laser beams at a numerical aperture device, configured to generate a second focused beam on a substrate.

11. The method of claim 10, wherein the wave-front shaping module, further comprises a compensation pattern generated based at least partly on the pattern of scattering by the one or more scattering mediums, wherein the compensation pattern is learned and generated with one or more machine learning, stochastic search, and Metropolis-Hastings.

12. The method of claim 10, further comprising providing a mask, wherein the mask comprises a pattern of integrated circuit devices to be fabricated on the substrate, wherein the substrate comprises a silicon wafer.

13. The method of claim 10, wherein the wave-front shaping module comprises a fabrication mask, comprising a pattern of integrated circuit devices to be fabricated on the substrate, and wherein the substrate comprises a silicon wafer.

14. The method of claim 10, wherein the wave-front shaping module comprises one or more of a holographic mask, a normal mask, a digital micrometer device, and a spatial light modulator.

15. The method of claim 10, wherein the wave-front shaping module comprises an array of phase-modulated segments, whose positions and phase can be adjusted with a learning feedback algorithm to generate the one or more focused laser beams.

16. The method of claim 10, further comprising:
generating a transmission matrix based on input/output response of the scattering medium;
determining a correlation between the transmission matrix and the scrambled laser beams; and
based on the correlation, configuring the wave-front shaping module to receive the scattered laser beams and generate the one or more focused laser beams.

17. The method of claim 10, further comprising:
depositing nonlinear photoresist material on the substrate, wherein the photoresist material undergoes polymerization depending on wavelengths of light received at the nonlinear photoresist material; and
selectively emitting laser beams from the light sources at a plurality of wavelengths, wherein the wavelengths are chosen based at least partly on a pattern to be formed in the nonlinear photoresist material.

18. The method of claim 10, wherein the substrate comprises Mercapto-functional polymers.

19. A method of STED-enhanced scattering lithography comprising: generating excitation laser beams from a first STED light source; generating depletion laser beams from a second STED light source;
scrambling the excitation and depletion laser beams with one or more scattering mediums;
descrambling the scrambled laser beams with the one or more wave-front shaping modules; wherein a first scattering medium receives the excitation laser beams and a first wave front-shaping module receives respective scrambled laser beams from the first scattering medium to generate one or more first descrambled laser beams; wherein a second scattering medium receives the depletion laser beams and a second wave front-shaping module receives respective scrambled laser beams from the second scattering medium to generate one or more second descrambled laser beams; and
generating an effective illumination spot on a substrate, wherein the effective illumination spot comprises a sub-diffraction limit resolution and the effective illumination spot further comprises the descrambled laser beams.

20. The method of claim 19, wherein the effective illumination spot further comprises a Gaussian spot generated from the descrambled excitation laser beams and a doughnut depletion region generated from the descrambled depletion laser beams.

* * * * *